(12) United States Patent
Mohammad et al.

(10) Patent No.: US 7,811,862 B2
(45) Date of Patent: Oct. 12, 2010

(54) THERMALLY ENHANCED ELECTRONIC PACKAGE

(75) Inventors: Anwar A. Mohammad, San Jose, CA (US); Soon Ing Chew, Milpitas, CA (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/337,347

(22) Filed: Dec. 17, 2008

(65) Prior Publication Data

US 2010/0148326 A1 Jun. 17, 2010

(51) Int. Cl.
*H01L 21/44* (2006.01)
*H01L 21/48* (2006.01)
*H01L 21/50* (2006.01)

(52) U.S. Cl. .................... 438/122; 438/123; 438/124; 257/E23.031

(58) Field of Classification Search ......... 438/122–124; 257/E23.031

See application file for complete search history.

(56) References Cited

U.S. PATENT DOCUMENTS

| 4,574,564 | A  | 3/1986  | Pester         |
|-----------|----|---------|----------------|
| 4,965,227 | A  | 10/1990 | Chang et al.   |
| 5,144,412 | A  | 9/1992  | Chang et al.   |
| 5,473,402 | A  | 12/1995 | Long et al.    |
| 6,700,181 | B1 | 3/2004  | Coccioli       |
| 7,015,631 | B2 | 3/2006  | Hirasawa et al.|

OTHER PUBLICATIONS

De Heus, Rob. "Self Qualification Results: NiPdAu pre-plated leadframes, Green Molding Compound and Green Die-Attach for SSOP16/20/24/28 packages assembled at Subcontractor Amkor Technologies Philippines." IMO Background Innovation, Divisional Philips Semiconductors, Philips Internal Report No. RNR-83-05/RdH/RdH-2008, QTS Report Database No. 050093, Feb. 1, 2005.

*Primary Examiner*—Thien F Tran
(74) *Attorney, Agent, or Firm*—Coats & Bennett, P.L.L.C.

(57) ABSTRACT

According to one embodiment, an electronic package includes a semiconductor die, a heat sink and a metallization layer interposed between the semiconductor die and the heat sink. The metallization layer attaches the semiconductor die to the heat sink. The metallization layer has a thickness of about 5 μm or less and a thermal conductivity of about 60 W/m·K or greater.

11 Claims, 7 Drawing Sheets

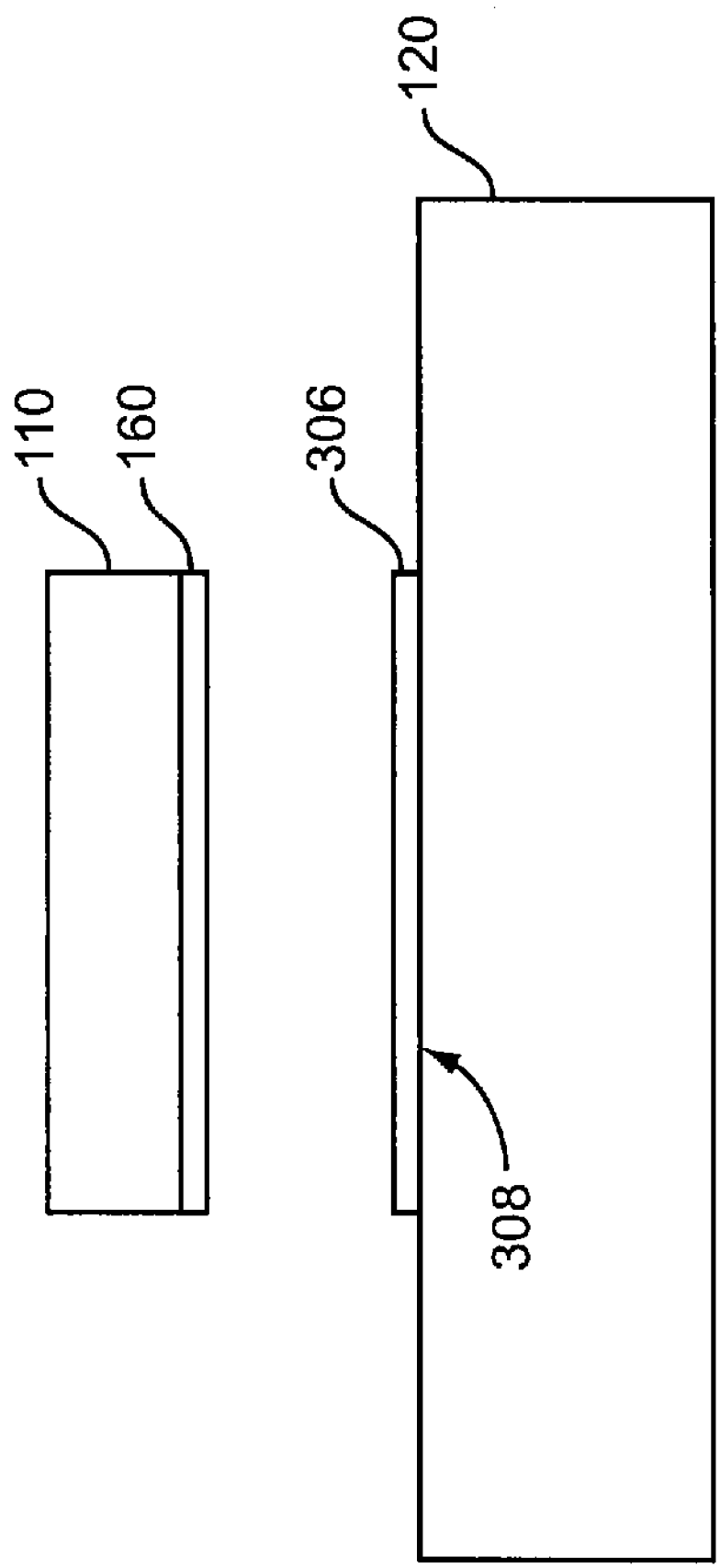

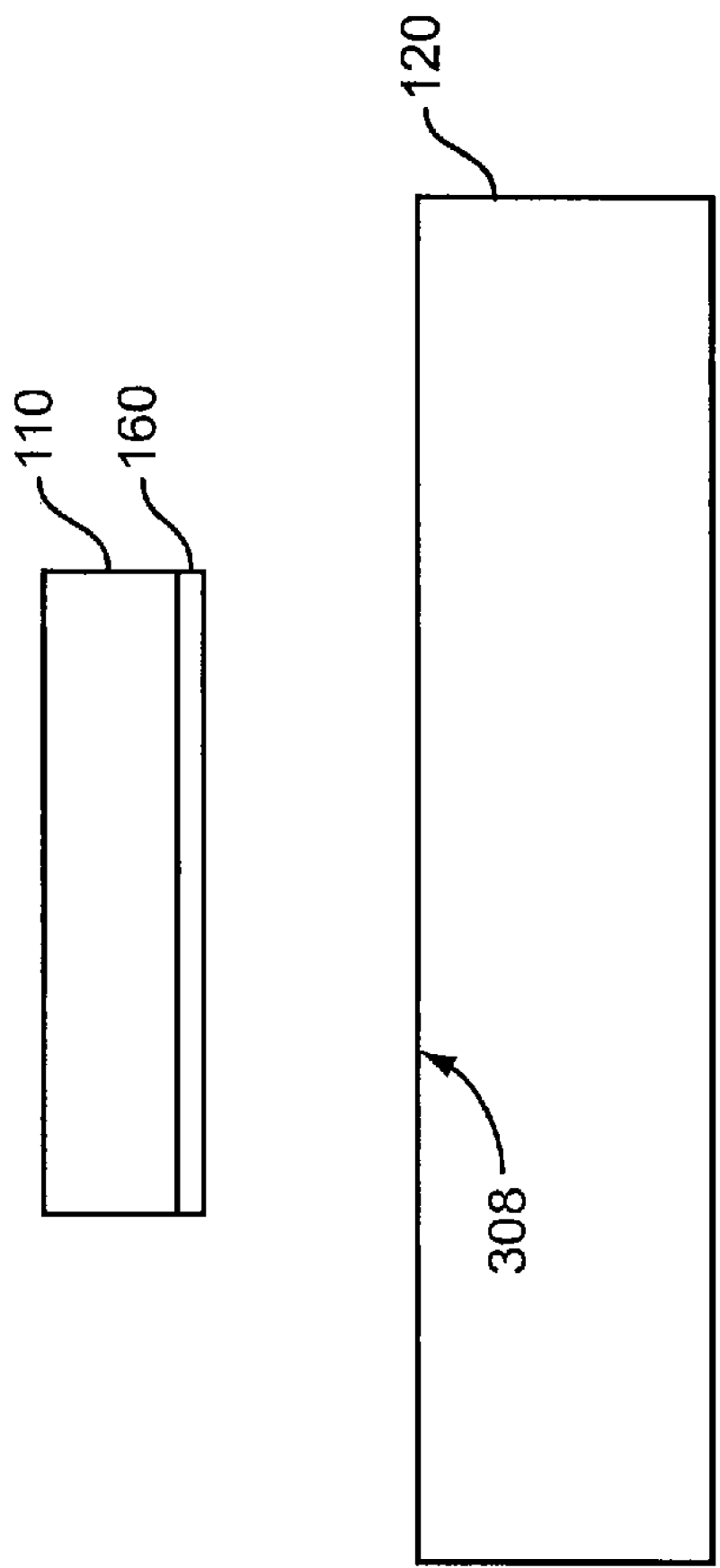

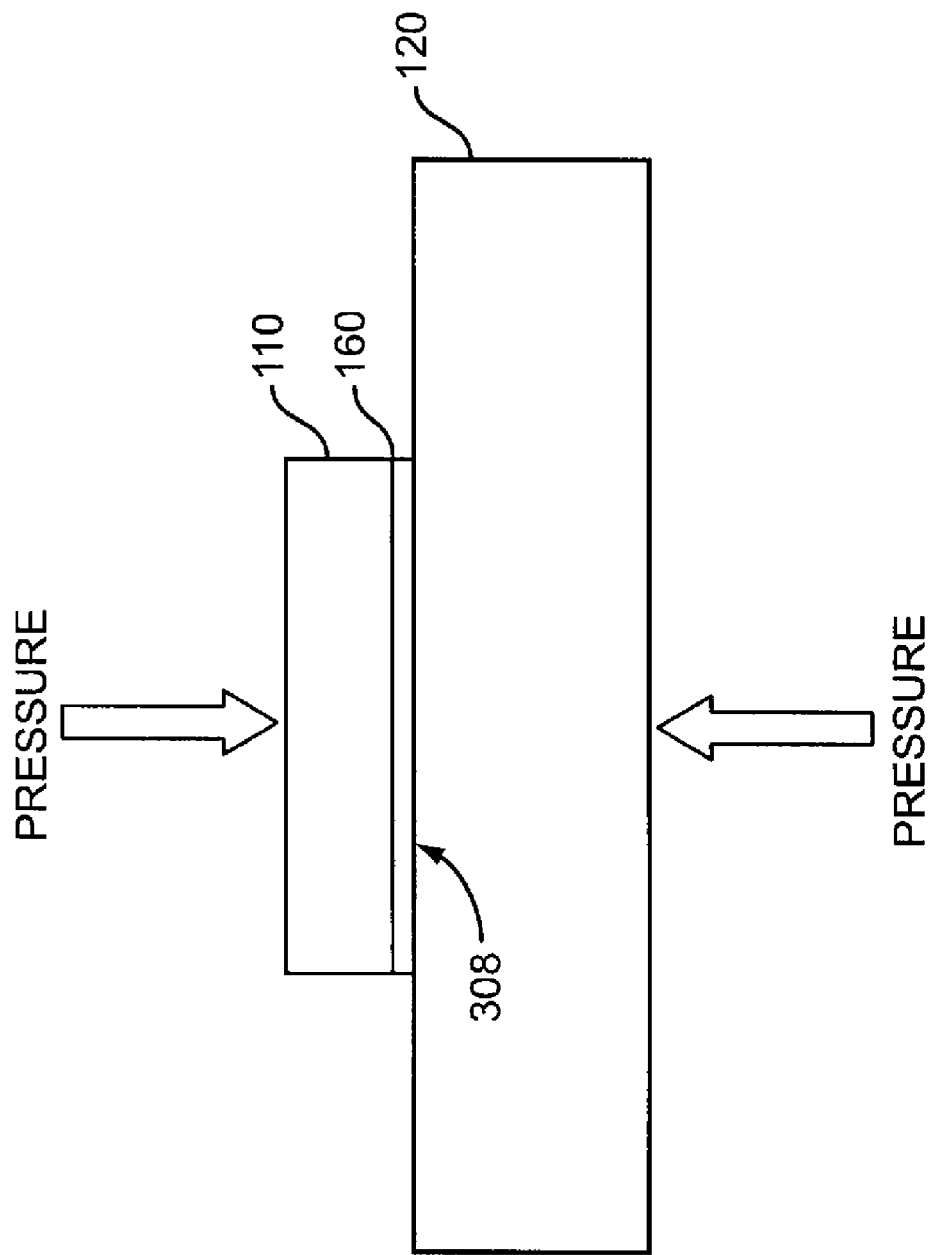

THERMALLY ENHANCED ELECTRONIC PACKAGE

BACKGROUND

A plastic package which houses an electronic component such as a power transistor is typically manufactured by attaching the electronic component to a metal lead frame and then molding a polymer over the assembly to encapsulate the component and lead frame. The electronic component is conventionally attached to the lead frame using either an epoxy or metallization bonding material. Epoxy and metallization bonding materials have a direct affect on the thermal performance of the plastic package. The thermal performance of the package is especially critical for high power applications.

Several factors associated with the bonding material affect package thermal performance. For example, the thickness of the bonding material, commonly referred to as bond line thickness, affects thermal performance. Conventional metallization bonding materials such as PbSn or Pb-free solders are relatively thick, e.g., ranging from about 15 µm to 25 µm or even thicker. Thermal performance of the plastic package decreases as bond line thickness increases. An epoxy can be used to attach an electronic component to a lead frame. However, epoxies have relatively low thermal conductivity of about 20-25 W/m·K, limiting the amount of heat which can be dissipated from the electronic component to the lead frame. Conventional metallization bonding materials such as PbSn or Pb-free solders have a thermal conductivity higher than epoxies of about 30-50 W/m·K. However, an even greater thermal conductivity is desirable for high power applications.

The thermal performance of the plastic package is also affected by the amount of voids in the bonding material. Conventional epoxy and metallization bonding materials tend to have about 5-15% voids. Package thermal performance decreases as the number of voids in the bonding material increases. Package thermal performance further degrades when the lead frame bows during the bonding process and subsequent cool-down period. The lead frame and electronic component usually have different CTEs (coefficients of thermal expansion). As such, the lead frame and component expand and contract at different rates during the bonding process. Conventional lead frames are typically made from a type of conductive material that becomes pliable at bonding temperatures. Accordingly, the lead frame can bow during the bonding process and subsequent cool-down period. An uneven thermal interface between the lead frame and a heat sink attached to the lead frame further degrades thermal performance of the package.

SUMMARY

According to an embodiment, an electronic package includes a semiconductor die, a heat sink and a metallization layer interposed between the semiconductor die and the heat sink. The metallization layer attaches the semiconductor die to the heat sink. The metallization layer has a thickness of about 5 µm or less and a thermal conductivity of about 60 W/m·K or greater.

Those skilled in the art will recognize additional features and advantages upon reading the following detailed description, and upon viewing the accompanying drawings.

BRIEF DESCRIPTION OF THE DRAWINGS

FIGS. 3A-3E illustrate cross-sectional views during different stages of manufacturing the electronic package of FIG. 1.

DETAILED DESCRIPTION

Figure 1:
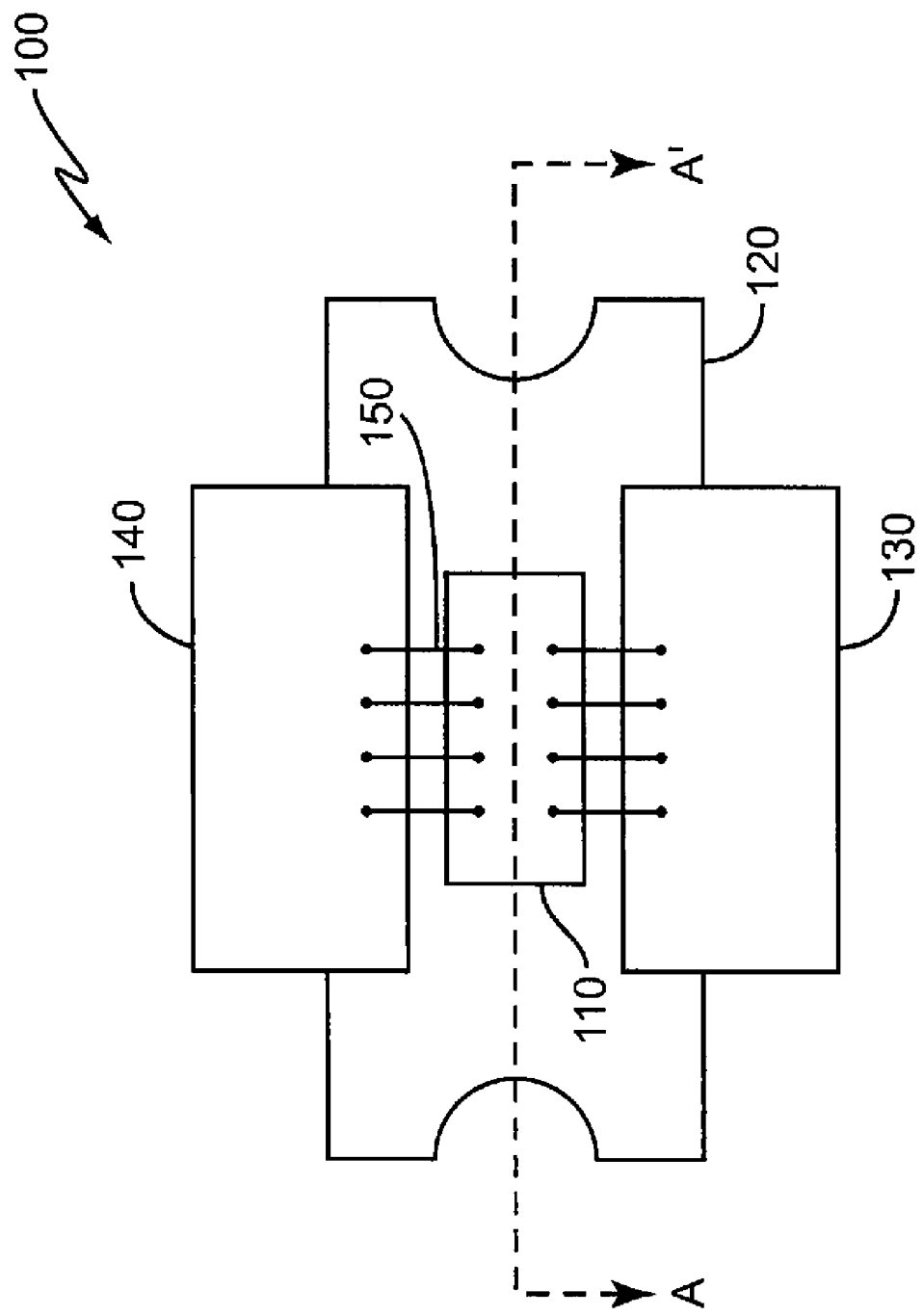
FIG. 1 illustrates a plan view of an embodiment of an electronic package.
Figure 2:
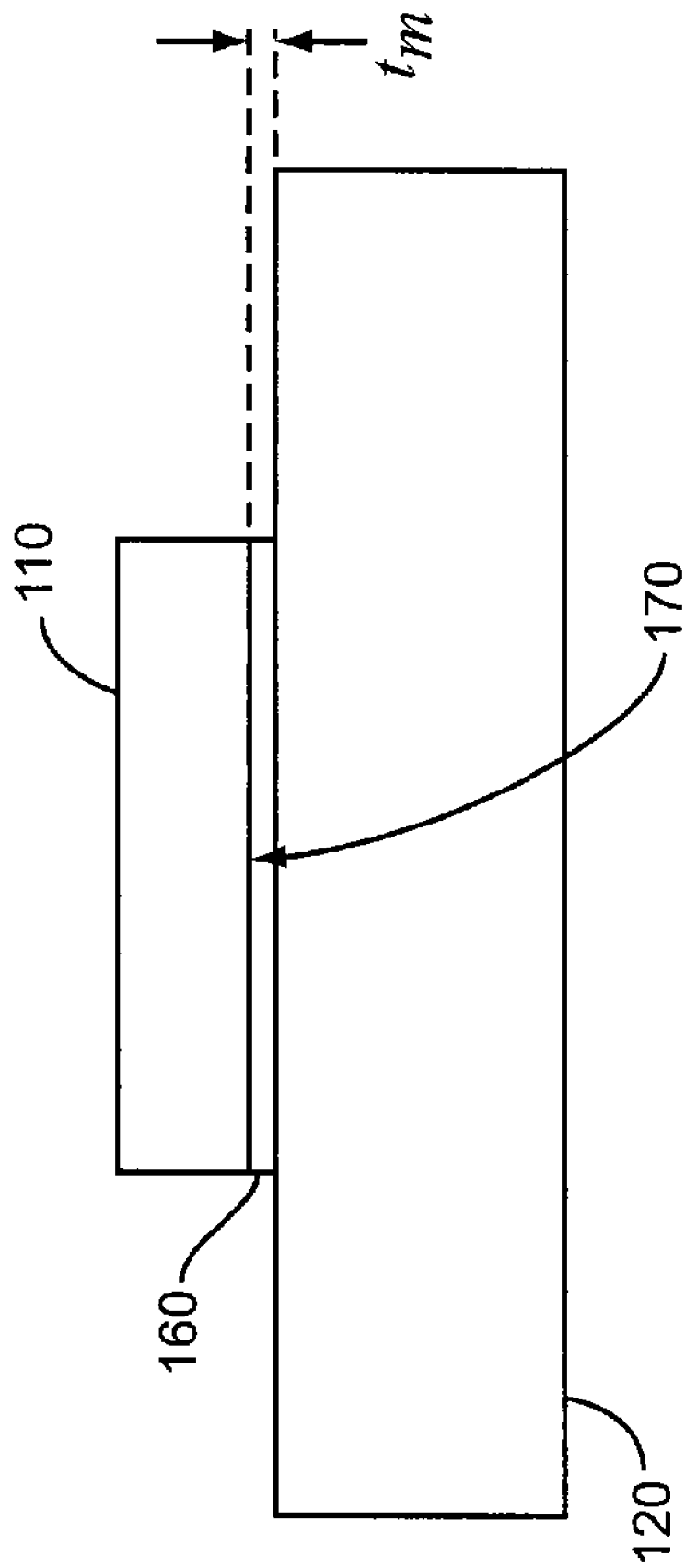
FIG. 2 illustrates a cross-sectional view of the electronic package of FIG. 1.

FIG. 1 illustrates a plan view of an embodiment of an electronic package 100 including a semiconductor die 110 attached to a lead frame 120. FIG. 2 illustrates a cross-sectional view of the package 100 along line A-A' in FIG. 1. The lead frame 120 supports the semiconductor die 110 and also acts as a heat sink, transferring waste heat energy away from the die 110 during operation. The electronic package 100 also includes one or more leads 130, 140 for providing external electrical contacts to the semiconductor die 110. Bond wires 150 or other types of connections electrically couple each lead 130, 140 to the die 110. The die 110 and the lead frame 120 can be encapsulated in a plastic molding compound (not shown in FIGS. 1 and 2). Also, additional die and/or other components such as capacitors, resistors, inductors, etc. (not shown) can be assembled on the lead frame 120. The semiconductor die 110 can include any type of integrated circuit such as a power transistor, etc. and can be fabricated on any type of semiconductor substrate such as silicon, gallium arsenide, silicon germanium, etc. The die 110 is attached to the lead frame 120 using a metallization layer 160 deposited on the bonding surface 170 of the die 110. The metallization layer 160 has a thickness ($t_m$) of about 5 µm or less and a thermal conductivity of about 60 W/m·K or greater. Accordingly, the metallization layer 160 provides a very high performance thermal interface between the semiconductor die 110 and the lead frame 120.

In one embodiment, the metallization layer 160 is a thin layer of AuSn deposited on the die bonding surface 170. The AuSn metallization layer 160 has a thickness of about 5 µm or less and a thermal conductivity of about 60 W/m·K or greater. According to one embodiment, the AuSn metallization layer 160 comprises about 75% Au and 25% Sn. In another embodiment, the AuSn metallization layer 160 comprises about 80% Au and 20% Sn. In still another embodiment, the metallization layer 160 is a thin layer of AuSi deposited on the bonding surface 170 of the semiconductor die 110. The AuSi metallization layer 160 has a thickness of about 5 µm or less and a thermal conductivity of about 190 W/m·K or greater.

Figure 3A:
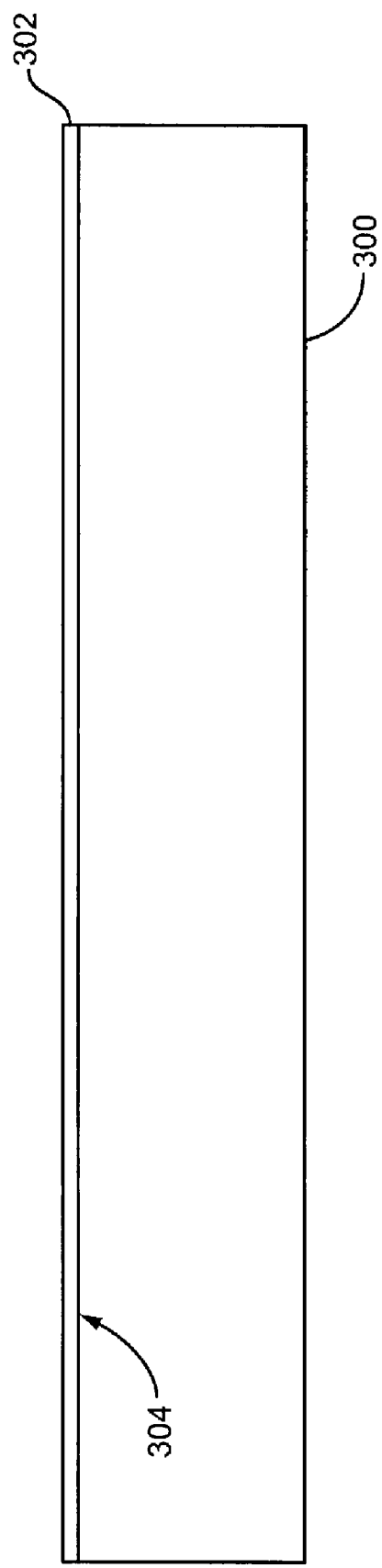

FIGS. 3A-3E illustrate cross-sectional views associated with different steps during manufacturing of the electronic package 100. FIG. 3A shows a semiconductor wafer 300 after a thin metallic layer 302 of about 5 µm or less is deposited on a surface 304 of the wafer 300. The thin metallic layer 302 forms the die metallization layer 160 after wafer dicing. The wafer 300 can comprise any type of semiconductor material such as silicon, gallium arsenide, silicon germanium, etc. According to one embodiment, a layer of AuSn is sputtered onto the wafer surface 304 and has a thickness of about 5 µm or less. According to another embodiment, a layer of AuSi is deposited on the wafer surface 304 and has a thickness of about 5 µm or less. The wafer 300 is then diced into individual semiconductor die 110 using any suitable dicing process. One or more of the dies 110 are then attached to the lead frame 120 or other type of heat sink.

FIG. 3B illustrates one embodiment where the semiconductor die 110 is aligned with the lead frame lead 120 prior to bonding. According to this embodiment, a preform layer 306 such as AuSn or other type of material is arranged on a bonding surface 308 of the lead frame 120. This way, the thin metallization layer 160 deposited on the die 110 can be bonded with the preform layer 306 arranged on the lead frame 120. In one embodiment, the materials of the metallization layer 160 and preform layer 306 are selected so that a eutectic bond is formed. Other bond types are within the scope of the embodiments described herein and depend on the type of materials used for the metallization and preform layers 160, 306.

FIG. 3C illustrates another embodiment where the semiconductor die 110 is aligned with the lead frame 120 lead prior to bonding and no preform layer is formed on the lead frame 120. According to this embodiment, the thin metallization layer 160 deposited on the semiconductor die 110 will be bonded directly to the bonding surface 308 of the lead frame 120.

The semiconductor die 110 is then bonded to the lead frame 120 as shown in FIG. 3D. FIG. 3D shows the lead frame 120 without the preform layer 306, and thus the metallization layer 160 deposited on the die 110 is directly bonded to the bonding surface 308 of the lead frame 120. Alternatively, the lead frame 120 can include the preform layer 306 to which the metallization layer 160 bonds. In either case, the semiconductor die 110 is bonded to the lead frame 120 by applying an elevated temperature and a force of at least 70N to the die 110 and lead frame 120 so that the metallization layer 160 adequately attaches the die 110 to the lead frame 120. The bonding temperature is about 278° C. or above when the metallization layer 160 comprises Au80Sn20 (Au80Sn20 has a melting point of 278° C.). The bonding temperature is about 367° C. or above when the metallization layer 160 comprises eutectic AuSi (eutectic AuSi has a melting point of 367° C.).

A force of at least 70N is applied to the semiconductor die 110 and the lead frame 120 to ensure adequate bonding because the metallization layer 160 is relatively thin (about 5 μm or less). Conventional semiconductor dies are bonded to heat sinks at much lower forces of about 20N or less because the die attach material is much thicker and a greater force is not needed. In addition, a bonding pressure of about 70N or greater results in about 3% or less voids in the metallization layer 160 after bonding. Having 3% or less voids in the metallization layer 160 after bonding substantially improves the thermal performance of the interface between the semiconductor die 110 and the lead frame 120. In one embodiment, the die 110 and lead frame 120 are bonded together in the presence of a forming gas such as Ni90H10, Ni80H20, etc. The metallization layer 160 deposited on the die 110 can be gently scrubbed against the bonding surface 308 of the lead frame 120 or against the optional preform layer 306 if present to enhance the bonding process. Scrubbing the metallization layer 160 in this way acts as a catalyst to enable a die attach with minimum voids.

Figure 3E:
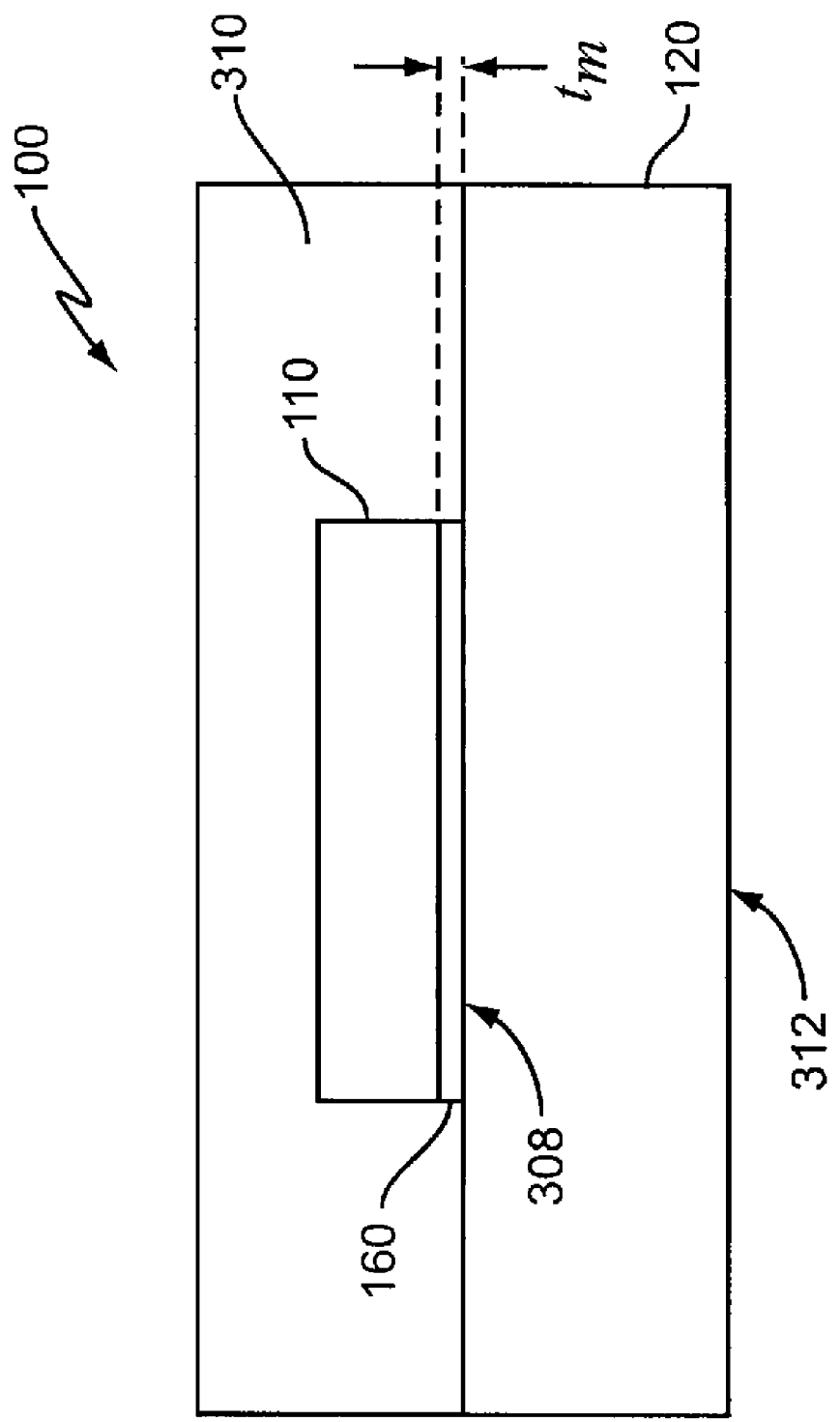

FIG. 3E shows the electronic package 100 after the semiconductor die 110 is bonded to the lead frame 120 and a plastic molding compound 310 is formed over the die 110 and lead frame 120. In one embodiment, the plastic molding compound 310 comprises a $SiO_2$ filled epoxy molding compound such as the G600 molding compound sold by Sumitomo Bakelite Co. The plastic molding compound 310 encapsulates the semiconductor die 110 and the lead frame 120.

The lead frame 120 can comprise any suitable thermally conductive material. In one embodiment, the lead frame 120 comprises C19210 copper alloy. According to this embodiment, a bottom surface 312 of the lead frame 120 is not covered by the molding compound 310 as shown in FIG. 3E and is thus exposed. C19210 copper alloy remains relatively rigid and does not bow or otherwise deform as much at the die attach bonding temperature (e.g., around 300° C. or above). Accordingly, the bottom surface 312 of the lead frame 120 retains a relatively planar shape during the die attach process. The relatively flat bottom surface 312 of the lead frame 120 can be attached in good thermal contact to a larger heat sink (not shown), further increasing the thermal performance of the electronic package 100.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing an electronic package, comprising:
    placing a semiconductor die on a lead frame so that a metallization layer arranged on a surface of the semiconductor die is interposed between the semiconductor die and the lead frame, the metallization layer having a thickness of about 5 μm or less and a thermal conductivity of about 60 W/m·K or greater; and
    applying an elevated temperature and a force of at least 70N to the semiconductor die and the lead frame so that the metallization layer attaches the semiconductor die to the lead frame.

2. The method of claim 1, wherein placing the semiconductor die on the lead frame comprises placing the metallization layer in direct contact with a surface of the lead frame.

3. The method of claim 1, wherein placing the semiconductor die on the lead frame comprises placing the metallization layer in direct contact with a preform layer arranged on the lead frame.

4. The method of claim 1, further comprising forming a plastic molding compound over the semiconductor die and the lead frame after the semiconductor die is attached to the lead frame.

5. A method of manufacturing an electronic package, comprising:
    depositing on a semiconductor wafer a metallization layer having a thickness of about 5 μm or less and a thermal conductivity of about 60 W/m·K or greater;
    dicing the semiconductor wafer into a plurality of dies;
    placing at least one of the dies on a lead frame so that the metallization layer is interposed between the at least one die and the lead frame; and
    applying an elevated temperature and a force of at least 70N to the at least one die and the lead frame so that the metallization layer attaches the at least one die to the lead frame.

6. The method of claim 5, wherein depositing the metallization layer on the semiconductor wafer comprises sputtering AuSn onto a surface of the semiconductor wafer.

7. The method of claim 5, wherein depositing the metallization layer on the semiconductor wafer comprises depositing AuSi onto a surface of the semiconductor wafer.

8. The method of claim 5, wherein placing at least one of the dies on the lead frame comprises placing the metallization layer deposited on the at least one die in direct contact with a surface of the lead frame.

9. The method of claim 5, wherein placing at least one of the dies on the lead frame comprises placing the metallization layer deposited on the at least one die in direct contact with a preform layer arranged on a surface of the lead frame.

10. The method of claim 5, further comprising forming a plastic molding compound over the at least one die and the lead frame.

11. The method of claim 10, wherein forming a plastic molding compound over the at least one die and the lead frame comprises forming a $SiO_2$ filled epoxy molding compound over the at least one die and the lead frame.

* * * * *